(12) United States Patent
Hsieh et al.

(10) Patent No.: US 6,605,491 B1
(45) Date of Patent: Aug. 12, 2003

(54) METHOD FOR BONDING IC CHIPS TO SUBSTRATES WITH NON-CONDUCTIVE ADHESIVE

(75) Inventors: Yu-Te Hsieh, Taoyuan (TW); Shyh-Ming Chang, Hsinchu (TW); Wen-Ti Lin, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/152,468

(22) Filed: May 21, 2002

(51) Int. Cl.$^7$ .............................................. H01L 21/44
(52) U.S. Cl. ...................... 438/118; 438/108
(58) Field of Search .................................. 438/108, 118

(56) References Cited

U.S. PATENT DOCUMENTS 6,326,241 B1 * 12/2001 Belke et al. ................. 438/118
6,410,415 B1 * 6/2002 Estes et al. .................. 438/612
6,440,777 B2 * 8/2002 Cobbley et al. ............. 438/118

* cited by examiner

*Primary Examiner*—Richard Elms
*Assistant Examiner*—Beth E. Owens
(74) *Attorney, Agent, or Firm*—Tung & Associates

(57) ABSTRACT

A method for bonding an IC chip by a non-conductive adhesive that contains between about 5 weight % and about 25 weight % of a non-conductive filler is described. The filler particles in the filler material must have a hardness that is higher, and preferably at least two times higher, than the metal material forming the bump. Moreover, the filler particles must be non-electrically conductive such that electrical shorts between a plurality of bumps on the IC chip do not occur. The concentration of the filler in the adhesive must be high enough so as to reduce the CTE of the adhesive to match that of the IC chip and the substrate, and low enough so as not to impede the electrical communication between the bumps on the IC chip and the bond pads on the substrate.

12 Claims, 4 Drawing Sheets

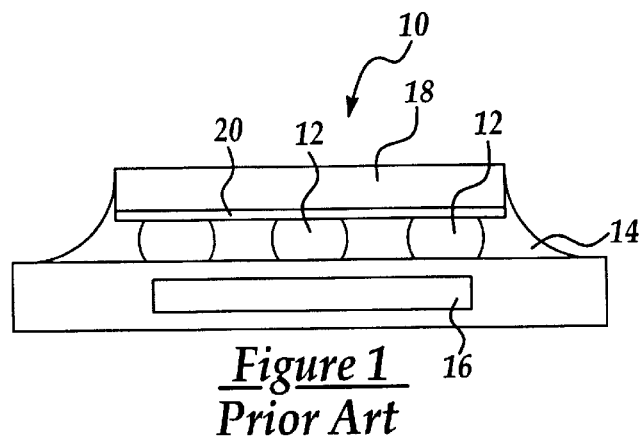
Figure 1
*Prior Art*
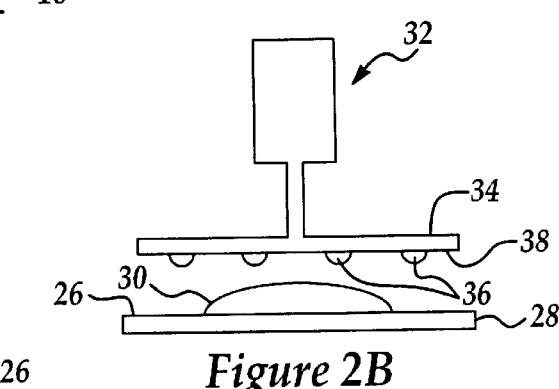
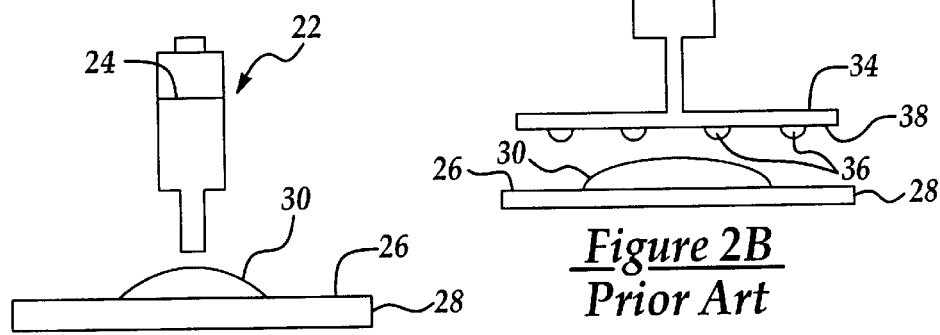
Figure 2A
*Prior Art*
Figure 2B
*Prior Art*
Figure 2C
*Prior Art*
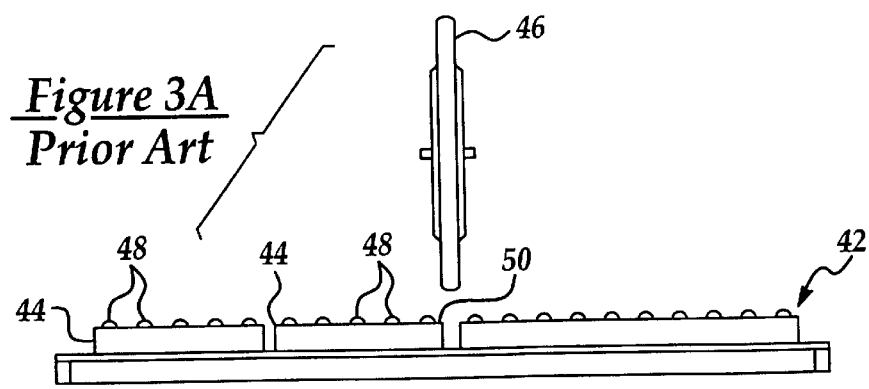
Figure 3A
*Prior Art*

METHOD FOR BONDING IC CHIPS TO SUBSTRATES WITH NON-CONDUCTIVE ADHESIVE

FIELD OF THE INVENTION

The present invention generally relates to a method for forming an IC chip/substrate assembly by bumps and an adhesive and assembly formed by the method, and more particularly, relates to a method for bonding an IC chip to a substrate by a non-conductive adhesive which contains between 5 and 25 weight percent of a non-conductive filler and assemblies formed by the method.

BACKGROUND OF THE INVENTION

In the fabrication of modern semiconductor devices, the ever increasing device density and decreasing device dimensions demand more stringent requirements in the packaging or interconnecting techniques of the devices. In recent years, a flip-chip attachment method or a flip-chip direct chip attachment (DCA) method has been used in packaging integrated circuit chips. In the flip-chip attachment method, instead of attaching an integrated circuit lead frame in a package, an array of solder balls is formed on the surface of the die for the subsequent bonding to a printed circuit board or an interposer. The formation of the solder balls can be carried out by an evaporation method utilizing a solder material consisting mainly of tin and lead through a mask to produce the balls in a desired pattern. More recently, the techniques of eletrodeposition or printing have been used to mass produce solder balls in a flip-chip packaging process.

In the direct chip attachment method, all the interconnections between a semiconductor chip and a printed circuit board (PCB) or a flexible substrate can be formed simultaneously and therefore maximizing fabrication throughputs. For instance, in direct chip attachment, solder bumps or solder balls are used to connect a chip directly to a printed circuit board or a flexible substrate. In a regular printed circuit board, the density of the interconnections is not formed high enough to match that normally found on a chip surface. In other words, the pitch between the bond pads formed on a chip is smaller than the pitch formed between interconnections on a printed circuit board. An interposer is therefore used to provide a transition and to accommodate the bond pads/interconnections which are spaced differently. An interposer board is frequently fabricated of the same material as that used in the printed circuit board, i.e., an epoxy-type polymeric material. When a high density interconnect printed circuit board is utilized in a flip-chip method for bonding to a semiconductor chip, the use of the interposer may not be necessary.

The use of organic substrates, or polymeric-base substrates, in printed circuit boards, flexible substrates or interposers introduces a new source of problem for the flip-chip bonding of a silicon chip which is mostly inorganic to such substrates. The problem is the mismatch of coefficients of thermal expansion (CTE) between the printed circuit board and the silicon chip. The coefficient of thermal expansion for the printed circuit board material is at least five times that of the silicon material. The extreme mismatch in CTE's between the silicon chip and the organic substrate of the printed circuit board therefore subjects solder joints formed thereinbetween to extremely large thermal strains, which leads to premature failure of the solder connections.

One method proposed for alleviating such thermal strains is the introduction of an encapsulating layer between the silicon chip and the organic substrate. The encapsulating material, known as an underfill, which is typically a silica filled epoxy is used to fill the gap (or standoff) between the printed circuit board and the silicon chip. Since the silicon chip is normally covered, in a final fabrication step, by a polymer passivation/stress buffer layer such as a polyimide film, the underfill forms a bond between the polyimide layer on the chip and the organic substrate of the printed circuit board encapsulating the solder joints.

Referring initially to FIG. 1, wherein a flip-chip 10 bonded by a plurality of solder balls 12 and an underfill layer 14 is shown. The encapsulating material, or the underfill layer 14, is typically a silica fill epoxy for filling the gap, or the standoff, between the printed circuit board 16 and the silicon chip 18. As shown in FIG. 1, the underfill layer 14 forms a bond between a polyimide layer 20, which is a passivation/stress buffer layer that covers the silicon chip 18, and the printed circuit board 16 encapsulating the solder balls 12.

While the introduction of the underfill layer between a silicon chip and an organic substrate for the printed circuit board has enhanced the thermal cycling resistance of a flip chip assembly, the dispensing of the underfill material in between a silicon chip and a substrate and filling the gap is a time consuming task. In one conventional method, as shown in FIGS. 2A~2C, an underfill dispenser 22 is first used to dispense an underfill material 24 onto the top surface 26 of a substrate 28. A layer 30 of the underfill material 24 is thus formed on the top surface 26. A chip holder 32, usually a vacuum holder, is then used to position an IC chip 34 which is pre-deposited with a plurality of solder balls 36 on a top surface 38 over the substrate 28. The IC chip, or die 34 is then pressed onto the substrate 28 with the plurality of solder balls 36 connecting to corresponding electrical conductors (not shown) on the surface 26 of the substrate 28. The assembly 40 for the flip chip is then placed in a reflow oven and heated to a temperature not less than the reflow temperature for the solder material utilized in the plurality of solder balls 36. The reflow process further cures the underfill material 30 and improves its mechanical strength.

Several drawbacks are inherent in this technique, for instance, there is possibly an underfill material layer between the plurality of solder balls on the IC chip and the plurality of electrical conductors on the substrate. Since the underfill material is an insulating material, this affects the contact resistance formed between the joints. Secondly, in the process of pressing the IC die 34 onto the underfill material layer 30, air entrapment in the underfill material 30 is inevitable. Trapped air bubbles in the underfill material layer 30, or in the epoxy material layer 30, affects the mechanical strength enhancement by the underfill material and furthermore, affects the adhesion formed between the underfill material and the IC die or the substrate.

In another conventional technique for dispensing underfill materials, as shown in FIGS. 3A~3F, an underfill material is fed into the standoff between an IC die and a substrate by the capillary effect on the underfill liquid. As shown in FIG. 3A, a wafer 42 is first sectioned into individual dies 44 by a diamond saw 46. The IC dies 44 are provided with a plurality of solder balls 48 on a top surface 50 of the dies. After all the dies 44 are severed from wafer 42, they are placed in a holding tray 52, as shown in FIG. 3B. In the next step of the process, a vacuum head 54 is used to remove an IC die 44 from the tray 52 and to position the die over a substrate 56. It is noted that a plurality of electrical conductors 58, corresponding to the number and positions of the solder balls 48 are provided on a top surface 60 of the substrate 56. It should be noted that the substrate 56 may be either a printed circuit board or an interposer. After the IC die 44 is mounted to substrate 56 by intimately contacting the solder balls 48 with the electrical conductors 58, as shown in FIG. 3D, a solder reflow process is carried out to reflow the solder and to form a permanent bond between the IC die 44 and the substrate 56. It should be noted that the plurality of electrical conductors 58 are not shown in FIG. 3D for simplicity reasons.

The flip chip package 62 is now ready for the underfill process in which an underfill dispenser 64, such as a liquid syringe, is used to dispense an underfill material 66 at an edge of the flip chip package 62. Since a gap 68, or the standoff, between the chip 44 and the substrate 56 is relatively small, i.e., in the neighborhood between about 50 $\mu$m and about 100 $\mu$m, a capillary effect causes the underfill material 66 to flow into the gap 68 and fill up the gap. Since the underfill dispensing process utilizes capillary effect, several factors may influence the underfill filling process. For instance, the viscosity of the underfill materials 56 and the temperature of the substrate 56 and the IC die 44. Moreover, the capillary flow process for the underfill material 56 is time consuming, i.e., up to 1 minute flow time is required to fill under an IC die which has a dimension of 10 mm×10 mm. A completed flip chip 62 with the underfill dispensed between the IC die 44 and the substrate 56 is shown in FIG. 3F.

In still another conventional technique in bonding an IC chip to a substrate, non-conductive adhesives have been used to achieve the bonding. This is shown in FIGS. 4A and 4B. An assembly 70 is formed by an IC chip 72 and a substrate 74 bonded together by a non-conductive adhesive 76. Electrical communication between the IC chips 72 and the substrate 74 is established between bond pads 78 on the IC chip 72 and the bond pads 80 on the substrate 74 with gold bumps 82. There is a serious thermal mismatch between the non-conductive adhesive 76 the silicon chip 72, and the polymeric-based substrate 74. After the bonding process by the non-conductive adhesive 76, the assembly 70 may bow or warp due to built-in thermal stresses. This is shown in FIG. 4B. An IC chip/assembly 70 bonded together with a non-conductive adhesive 76 without containing any fillers in the adhesive cannot pass a thermal stress test or any other thermal reliability test. A failed sample of the IC chip/substrate assembly after a thermal stress test, which was cycled between –55° C. and 125° C., is shown in FIG. 5 in an electronic scanning micrograph.

It is therefore an object of the present invention to provide a method for bonding an IC chip to a substrate by a non-conductive adhesive without the drawbacks or shortcomings of the conventional bonding method.

It is another object of the present invention to provide a method for bonding an IC chip to a substrate by a non-conductive adhesive which contains a non-conductive filler having a hardness larger than the hardness of the metal forming the bumps.

It is a further object of the present invention to provide a method for bonding an IC chip to a substrate by a non-conductive adhesive which contains just the right amount of a non-conductive filler material.

It is another further object of the present invention to provide a method for bonding an IC chip to a substrate by a non-conductive adhesive in which between about 5 weight % and about 25 weight % of a non-conductive filler is incorporated.

It is still another object of the present invention to provide a method for bonding an IC chip to a substrate by a non-conductive adhesive which contains between about 5 weight % and about 25 weight % of a filler of silica sand.

It is yet another object of the present invention to provide an IC chip/substrate assembly that is formed by a non-conductive adhesive containing between about 5 weight % and about 25 weight % of a non-conductive filler.

It is still another further object of the present invention to provide an IC chip/substrate assembly that is bonded together by a non-conductive adhesive containing a non-conductive filler which has a greater hardness than the hardness of the metal forming the bumps.

SUMMARY OF THE INVENTION

In accordance with the present invention, a method for bonding an IC chip to a substrate by a non-conductive adhesive and an IC ship/substrate assembly bonded together by the method are disclosed.

In a preferred embodiment, a method for bonding an IC chip to a substrate by a non-conductive adhesive can be carried out by the operating steps of providing an IC chip that has bumps formed on an active surface; providing a substrate that has bond pads formed on a top surface; depositing a non-conductive adhesive containing between about 5 and about 25 weight % of a non-conductive filler of a top surface of the substrate; aligning the bumps to the bond pads by positioning the active surface of the IC chip juxtaposed to the top surface of the substrate; and pressing the IC chip and the substrate together under heat and pressure.

In a method for bonding an IC chip to a substrate by a non-conductive adhesive, the non-conductive filler has a hardness that is larger than the hardness of the bump. The non-conductive filler may have a hardness that is at least two times larger than a hardness of the bumps. The bumps may be formed of a metal selected from the group consisting of Au, Ni and Sn-containing metal alloys. The substrate may be formed of a polymeric material, while the non-conductive adhesive may be a thermoset polymeric-based adhesive. The non-conductive filler may have a particle size between about 0.2 $\mu$m and about 20 $\mu$m, and preferably about 0.5 $\mu$m and about 10 $\mu$m. The non-conductive filler may be silica sand. The method may further include the step of depositing a non-conductive adhesive that preferably contains between about 10 and about 20 weight % of a non-conductive filler. The method may further include the step of pressing the IC chip and the substrate together in an inner lead bonder tool.

The present invention is further directed to an IC chip/substrate assembly which includes an IC chip that has bumps formed on an active surface; a substrate that has bond pads formed on a top surface; and a non-conductive adhesive disposed in between and bonding the IC chip and the substrate together in a phase-to-phase relationship with the bumps in electrical communication with the bump pads, the non-conductive adhesive contains between about five and about 25 weight percent of a non-conductive filler. The IC chip may be a driver chip for a LCD display panel. The non-conductive filler may have a hardness that is larger than that of the bump. The non-conductive filler may have particles that are pressed into the bump so as not to impede electrical communication between the bump and the bond pad. The non-conductive filler may have a particle size between about 0.2 $\mu$m and about 20 $\mu$m. The non-conductive adhesive may be a thermoset polymeric material. The non-conductive adhesive may be an epoxy, while the non-conductive filler may be silica particles. The bumps may be formed of a material selected from Au, Ni and Sn-containing alloys. The bumps may be formed of Au, and the bond pads may be formed of Cu. There is no bonding between the bump and the bond pad.

BRIEF DESCRIPTION OF THE DRAWINGS

These and other objects, features and advantages of the present invention will become apparent from the following detailed description and the appended drawings in which:

FIG. 1 is a schematic showing an enlarged, cross-sectional view of a conventional flip chip package including an IC die and a substrate bonded by a plurality of solder balls and an underfill material.

FIG. 2A is a schematic illustrating a conventional method for dispensing an underfill material on the top surface of a substrate.

FIG. 2B is a schematic showing the conventional method of FIG. 2A with an IC chip positioned on top of a substrate.

FIG. 2C is a schematic illustrating the conventional method for dispensing underfill shown in FIG. 2A after the IC die is bonded to the substrate with the underfill material thereinbetween.

FIG. 3A is a schematic of another conventional method in which a diamond saw is first used to sever IC dies from a wafer.

DETAILED DESCRIPTION OF THE PREFERRED EMBODIMENT

Figure 3B:
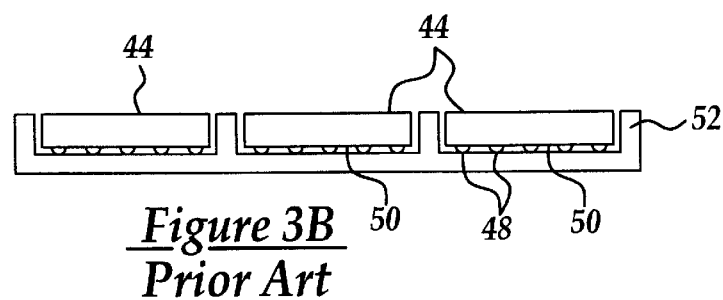
FIG. 3B is a schematic illustrating the severed IC dies positioned in a storage tray.
Figure 3C:
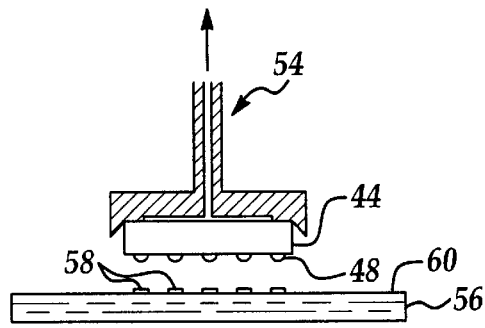
FIG. 3C is a schematic illustrating an IC die positioned over a corresponding substrate by a vacuum die holding device.
Figure 3D:
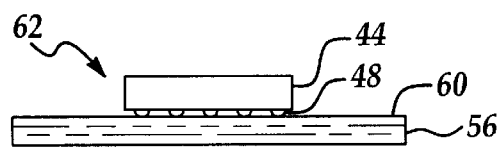
FIG. 3D is a schematic illustrating an IC die bonded to a substrate.
Figure 3E:
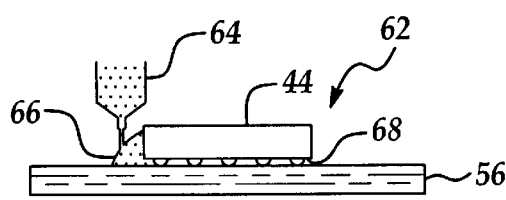
FIG. 3E is a schematic illustrating the flip chip package of FIG. 3D with the gap between the die and the substrate filled by capillary effect of an underfill material.
Figure 3F:
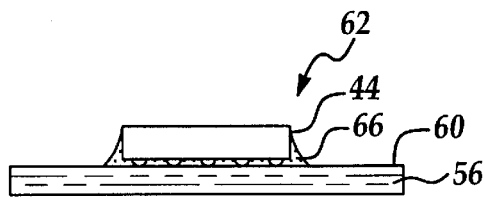
FIG. 3F is a schematic showing a flip chip package of FIG. 3E after the gap between the die and the substrate is filled with the underfill material.
Figure 4A:
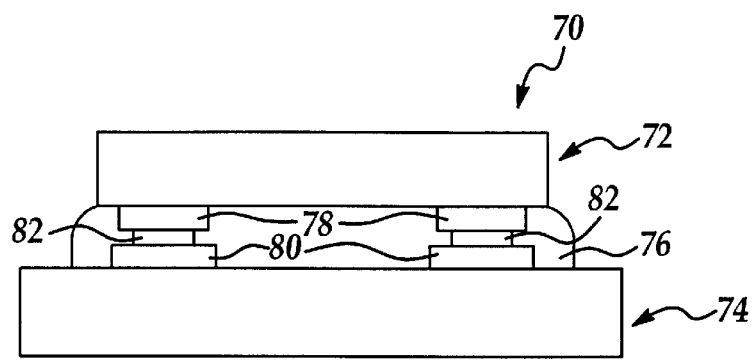
FIG. 4A is an enlarged, cross-sectional view of a third conventional IC chip/substrate assembly assembled together by a non-conductive adhesive.
Figure 4B:
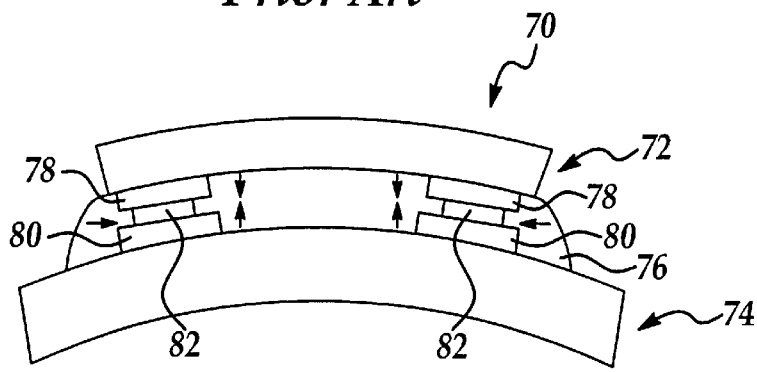
FIG. 4B is an enlarged, cross-sectional view of the IC chip/substrate assembly of FIG. 4A showing the effect of thermal mismatch, between the adhesive, the substrate and the IC chip.
Figure 5:
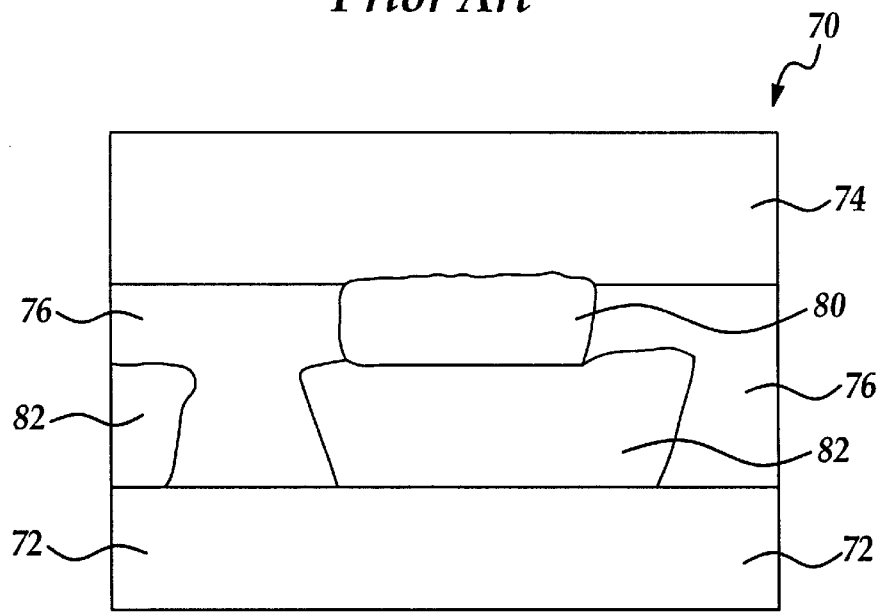
FIG. 5 is a graph illustrating an electron scanning micrograph of the IC chip/substrate assembly of FIG. 4B after failing a thermal stress test.

The present invention discloses a method for bonding an IC chip to a substrate by a non-conductive adhesive that contains a non-conductive filler in a narrow, specific concentration range of between about 5 weight % and about 25 weight % wherein the non-conductive filler has a hardness larger than the hardness of the metal bump. The metal bump may be formed of a metallic material such as Au, Ni, or Sn-containing alloys. The non-conductive filler may be silica particles, or any other suitable filler particles that have a hardness larger than, or preferably at least two times larger than, the hardness of the metal bump material.

In order for the present invention method for bonding an IC chip to a substrate by a non-conductive adhesive to function properly, three critical processing requirements must be met. First, the filler particles must be formed of a non-conductive material (i.e., non-electrically-conductive material). Secondly, the filler particles must have a hardness that is greater, and preferably at least two times greater, than the hardness of the metal material used to form the bumps such that the filler particles can be pressed into the top surface of the bump during the bonding operation conducted in an inner-lead bonder. Thirdly, the adhesive must contain just the right amount of the non-conductive filler, i.e., in between about 5 weight % and about 25 weight %. If too low a percentage of the filler is contained in the adhesive, the reduction in the coefficient of thermal expansion (CTE) of the adhesive is not sufficient such that a severe thermal mismatch between the adhesive, the IC chip and the substrate exists. On the other hand, if too high a concentration of the filler is present in the adhesive, an excessive number of filler particles may be present in the interface between the bond pad on the substrate and the bump on the IC chip such that electrical communication between the two cannot be established. The conventional non-conductive adhesive without any filler content cannot be utilized in the present invention IC chip/substrate assembly due to a thermal mismatch problem.

In a preferred embodiment, the present invention method for bonding an IC chip to a substrate can be carried out by the operating steps of first providing an IC chip that has gold bumps formed on an active surface; then providing a substrate that has copper bond pads formed on a top surface; a non-conductive adhesive that contains between about 5 and about 25 weight % of a non-conductive filler such as silica particles is then deposited on the top surface of the substrate; the bumps are then aligned with the bond pads by positioning the active surface of the IC chip juxtaposed to the top surface of the substrate; and the IC chip and the substrate are pressed together under heat and pressure to form the IC chip/substrate assembly.

The present invention is further directed to an IC chip/substrate structure that is constructed by an IC chip which has gold bumps formed on an active surface; a substrate that has copper bond pads formed on a top surface; and a non-conductive adhesive formed of between about 5 weight % and about 25 weight % of silica particles and epoxy disposed in between and bonding the IC chip and the substrate in a face-to-face relationship with the bumps in electrical communication with the bond pads.

While the present invention method for bonding an IC chip to a substrate can be used in any semiconductor assembly applications, it is particularly suitable for bonding an IC chip which is a driver chip for a LCD display panel to a flexible substrate.

Figure 6A:
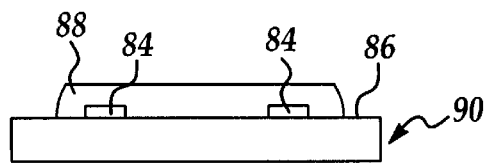
FIG. 6A is an enlarged, cross-sectional view of a present invention substrate with a non-conductive adhesive deposited on a top surface.

Referring now to FIG. 6A wherein a present invention substrate 90 that has bond pads 84 formed on a top surface 86 is shown. In the first step of the process, a non-conductive adhesive composition 88 is first deposited on the top surface 86 of the substrate 90 to cover not only the top surface 86, but also the bond pads 84. The non-conductive adhesive can be suitably formed of a thermoset polymeric material such as epoxy that contains between about 5 weight % and about 25 weight %, and preferably between about 10 weight % and about 20 weight % of a non-conductive filler. A suitable non-conductive filler utilized in the present invention method shown in the preferred embodiment is silica sand. The non-conductive filler particles 92 are shown in FIG. 7 in a graph illustrating an electron scanning micrograph of the present invention IC chip/substrate assembly 100 of FIG. 6D.

The non-conductive filler of silica sand should have a particle size between about 0.2 $\mu$m and about 20 $\mu$m, and preferably between about 0.5 $\mu$m and about 10 $\mu$m in diameter. In the preferred embodiment of the present invention, 13 weight % of the silica sand, or $SiO_2$ particles, is utilized. In order to produce an IC chip/substrate assembly that has high product reliability, which can pass a stringent thermal stress cycle test, the CTE (coefficient of thermal expansion) of the non-conductive adhesive material should be as close as possible to that of the IC chip (i.e., silicon) and that of the substrate. The substrate is normally formed of a polymeric material, i.e., when a flexible substrate is used, such as polyimide or polyester. For a flexible substrate 90, copper bond pads 84 are normally formed with, optionally, an adhesion layer between the copper and the substrate. The bond pads 84 may have a suitable thickness such as 12 $\mu$m, and a suitable diameter such as 40 $\mu$m.

Figure 6B:
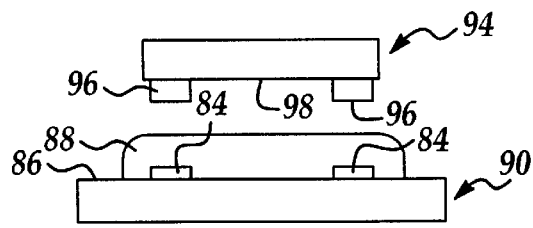
FIG. 6B is an enlarged, cross-sectional view of the present invention substrate of FIG. 6A with an IC chip positioned on top.

FIG. 6B illustrates an IC chip 94 that has a plurality of bumps 96 formed on an active surface 98 positioned on top of the substrate 90. The bumps 96 may be suitably formed of a metallic material that has a significantly lower hardness when compared to the hardness of the non-conductive filler particles 92. For instance, when the non-conductive filler particles 92 are silica particles, the bumps 96 may be suitably formed of Au such that the filler particles can be pressed into the top surface of the bump 96 and not to impede electrical communication between the bump 96 and the bond pad 84. The differential hardness between the filler particles and the bump material is a critical requirement of the present invention novel method that must be satisfied. When the bump material has a hardness similar to that of the filler particles, the filler particles will be stopped by the surface of the bump and thus forming a gap in between the surface of the bump and the surface of the bond pad after the bonding operation conducted in an inner-lead bonder. The gap impedes electrical communication between the bump and the bond pad, i.e., the electrical communication between the IC chip 94 and the substrate 90. The bumps 96 may also be formed of a material such as Ni, or solder alloys that contain Sn, either with Pb or without Pb.

Figure 6C:
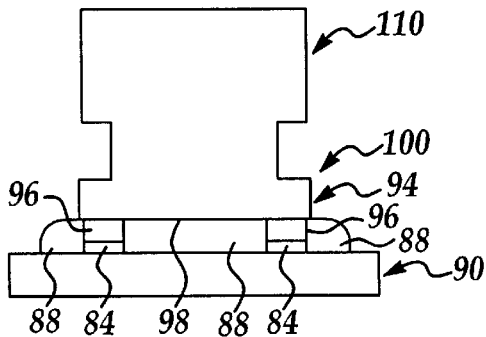
FIG. 6C is an enlarged, cross-sectional view of the present invention substrate and IC chip pressed together in an inner-lead bonder.

In the next step of the process, as shown in FIG. 6C, an inner-lead bonder 110 is used to bond the IC chip 94 and the substrate 90 together under suitable heat and pressure forming an IC chip/substrate assembly 100. The inner-lead bonder 110 is well known in the art and thus will not be described in detail.

Figure 6D:
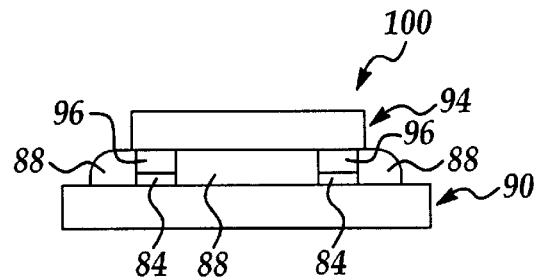
FIG. 6D is an enlarged, cross-sectional view of the present invention IC chip/substrate assembly bonded together by the non-conductive adhesive.
Figure 7:
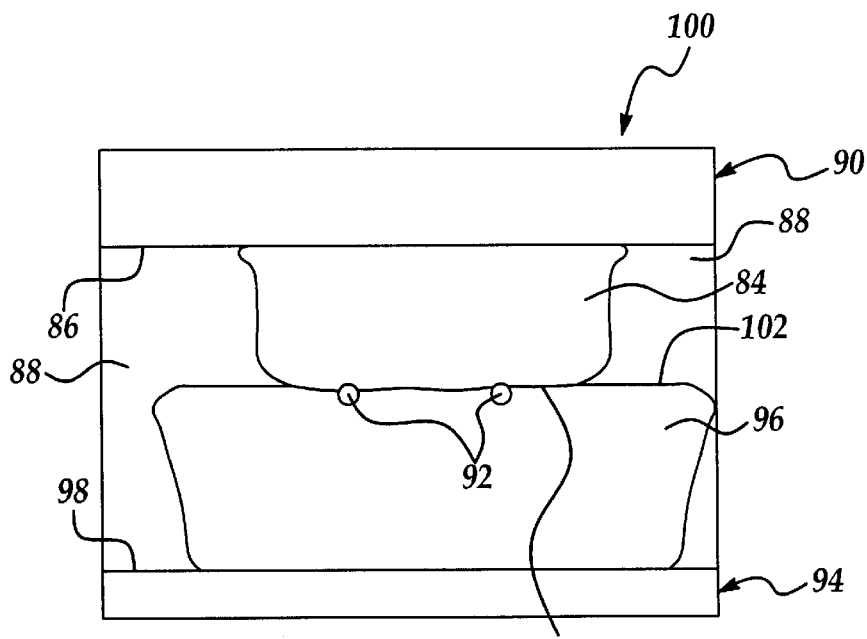
FIG. 7 is an electron scanning micrograph of the present invention IC chip/substrate assembly of FIG. 6D illustrating filler particles being pressed into the gold bump.

FIG. 6D shows an enlarged, cross-sectional view of the final assembly of the IC chip/substrate 100 after the bonding process is conducted in the inner-lead bonder 110. A further enlarged view obtained by electron scanning microscope is shown in FIG. 7. The novel features of the present invention method is clearly shown wherein the filler particles 92 are pressed into the top surface 102 of the gold bump 96 during the bonding process conducted in the inner-lead bonder 110. It is therefore noted that even though two filler particles 92 existed in the interface 104 between the gold bump 96 and the copper bond pad 84, the filler particles 92 do not impede electrical communication between the two since no gap at interface 104 is formed by the filler particles 92. This will not be the case when the bump material has a hardness equal or close to the hardness of the filler particles.

Moreover, as shown in FIG. 7, the concentration of the filler particles existed in the non-conductive adhesive is important since if too many filler particles existed at the interface 104 between the bump 96 and the bond pad 84, electrical communication between the two may be affected. On the other hand, if too low a concentration of the filler particles 92 existed in the non-conductive adhesive 88, the CTE of the adhesive 88 would not be low enough 30 as to match that of the IC chip 94 and the substrate 90 thus causing reliability problems after a thermal cycle test. Moreover, if the filler particles 92 are formed of an electrically conductive material, such as graphite particles, and the concentration of the particles is high enough in the adhesive 88, electrical shorts may occur in between the plurality of bumps 96 or the plurality of bond pads 84.

The present invention method and the critical requirements for the successful implementation of the method, i.e., the filler particles must be non-electrically conductive; the hardness of the filler particles must be significantly higher, i.e., at least two times higher, than the metal material forming the bumps; and furthermore, the concentration of the filler particles must be such that it is high enough to drop the CTE of the adhesive material while low enough not to impede electrical communication between the bumps and the bond pads have been clearly shown in the above description and in the appended drawings of FIGS. 6A~7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for bonding an IC chip to a substrate by a non-conductive adhesive comprising the steps of:

providing an IC chip having bumps formed on an active surface;

providing a substrate having bond pads formed on a top surface;

depositing a non-conductive adhesive containing between about 5 and about 25 wt. % of a non-conductive filler on said top surface of the substrate;

aligning said bumps to said bond pads by positioning said active surface of the IC chip juxtaposed to said top surface of the substrate; and pressing said IC chip and said substrate together under heat and pressure.

2. The method for bonding an IC chip to a substrate by a non-conductive adhesive according to claim 1, wherein said non-conductive filler has a hardness that is larger than the hardness of said bumps.

3. The method for bonding an IC chip to a substrate by a non-conductive adhesive according to claim 1, wherein said non-conductive filler has a hardness that is at least 2 times larger than a hardness of said bumps.

4. The method for bonding an IC chip to a substrate by a non-conductive adhesive according to claim 1, wherein said bumps are formed of a metal selected from the group consisting of Au, Ni and Sn-containing metal alloys.

5. The method for bonding an IC chip to a substrate by a non-conductive adhesive according to claim 1, wherein said bumps are formed of Au.

6. The method for bonding an IC chip to a substrate by a non-conductive adhesive according to claim 1, wherein said substrate is formed of a polymeric material.

7. The method for bonding an IC chip to a substrate by a non-conductive adhesive according to claim 1, wherein said non-conductive adhesive is a thermoset polymeric-based adhesive.

8. The method for bonding an IC chip to a substrate by a non-conductive adhesive according to claim 1, wherein said non-conductive filler has a particle size between about 0.2 $\mu$m and about 20 $\mu$m.

9. The method for bonding an IC chip to a substrate by a non-conductive adhesive according to claim 1, wherein said non-conductive filler has a particle size preferably between about 0.5 $\mu$m and about 10 $\mu$m.

10. The method for bonding an IC chip to a substrate by a non-conductive adhesive according to claim 1, wherein said non-conductive filler is silica sand.

11. The method for bonding an IC chip to a substrate by a non-conductive adhesive according to claim 1, further comprising the step of depositing a non-conductive adhesive that preferably contains between about 10 and about 20 wt. % of a non-conductive filler.

12. The method for bonding an IC chip to a substrate by a non-conductive adhesive according to claim 1, further comprising the step of pressing said IC chip and said substrate together in an inner lead bonder tool.

* * * * *